United States Patent
Kwon et al.

(10) Patent No.: US 8,034,664 B2
(45) Date of Patent: Oct. 11, 2011

(54) METHOD OF FABRICATING PASSIVE DEVICE APPLIED TO THE THREE-DIMENSIONAL PACKAGE MODULE

(75) Inventors: Young-Se Kwon, Daejeon (KR); Kyoung Min Kim, Daejeon (KR)

(73) Assignee: Wavenics Inc., Daejeon (KR)

( * ) Notice: Subject to any disclaimer, the term of this patent is extended or adjusted under 35 U.S.C. 154(b) by 0 days.

(21) Appl. No.: 12/914,725

(22) Filed: Oct. 28, 2010

(65) Prior Publication Data

US 2011/0037164 A1     Feb. 17, 2011

Related U.S. Application Data

(62) Division of application No. 12/158,726, filed as application No. PCT/KR2006/000751 on Mar. 3, 2006, now Pat. No. 7,851,918.

(30) Foreign Application Priority Data

Dec. 29, 2005  (KR) .................. 10-2005-0133793

(51) Int. Cl.
*H01L 21/44* (2006.01)
(52) U.S. Cl. ......... 438/118; 438/618; 438/620; 438/623
(58) Field of Classification Search ......... 438/618–624, 438/637–638, 672–673, 106–127
See application file for complete search history.

(56) References Cited

U.S. PATENT DOCUMENTS

| | | | |
|---|---|---|---|
| 3,903,590 A | 9/1975 | Yokogawa | |
| 5,043,794 A * | 8/1991 | Tai et al. | 257/686 |
| 5,198,693 A | 3/1993 | Imken et al. | |
| 5,629,559 A | 5/1997 | Miyahara | |
| 5,818,106 A | 10/1998 | Kunimatsu | |
| 2007/0247048 A1 | 10/2007 | Zhang et al. | |

FOREIGN PATENT DOCUMENTS

| | | |
|---|---|---|
| EP | 1225629 | 7/2002 |
| FR | 2818804 | 6/2008 |
| JP | 06-053344 | 2/1994 |
| JP | 12133745 | 5/2000 |
| JP | 14124594 | 4/2002 |
| JP | 2005-005549 | 1/2005 |

OTHER PUBLICATIONS

Cooper et al., "Multichip-on-Flex Plastic Encapsulated MHDI-Low Cost Substrateless Manufacturing for Microwave and Millimeterwave Modules," IEEE MTT-S International Microwave Symposium Digest, Jun. 17-21, 1996, pp. 219-222.

(Continued)

*Primary Examiner* — Dung A. Le

(74) *Attorney, Agent, or Firm* — Sheridan Ross P.C.

(57) ABSTRACT

Provided is a three-dimensional aluminum package module including: an aluminum substrate; an aluminum oxide layer formed on the aluminum substrate and having at least one first opening of which sidewalls are perpendicular to an upper surface of the aluminum substrate; a semiconductor device mounted in the first opening using an adhesive; an organic layer covering the aluminum oxide layer and the semiconductor device; and a first interconnection line and a passive device circuit formed on the organic layer and the aluminum oxide layer.

5 Claims, 8 Drawing Sheets

OTHER PUBLICATIONS

Extended European Search Report for European Patent Application No. 06716201.6, dated Aug. 13, 2010.

International Preliminary Report on Patentability for International (PCT) Patent Application No. PCT/KR2006/000751, issued Jul. 1, 2008.

Background of the invention for the above captioned application (previously cited).

International Search Report prepared by the Korean Intellectual Property Office on Sep. 13, 2006 for PCT/KR2006/000751; Applicant, Wavenics Inc.

* cited by examiner

[Fig. 1]
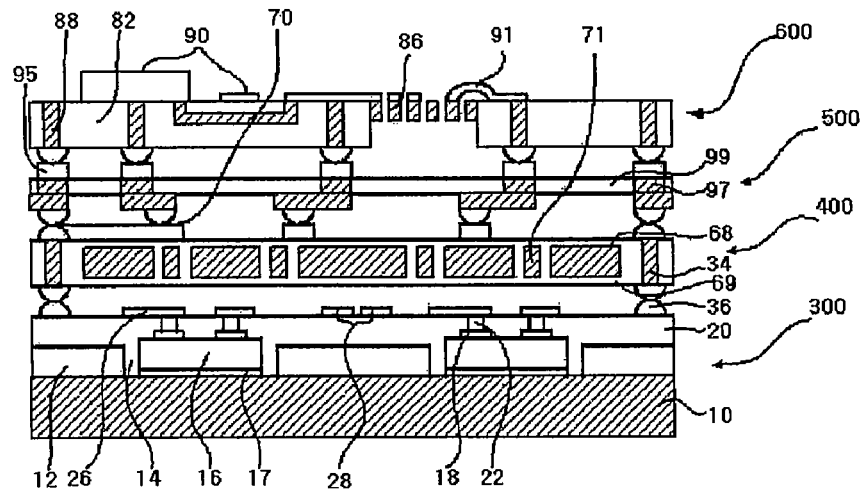
[Fig. 2]
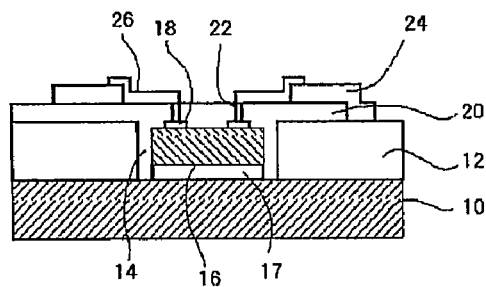
[Fig. 3]
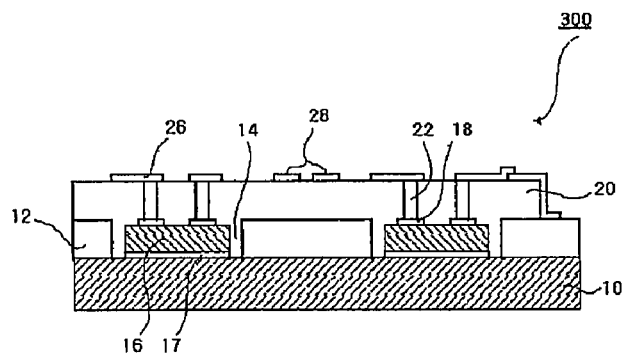
[Fig. 4]
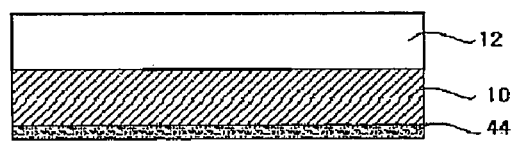
[Fig. 5]
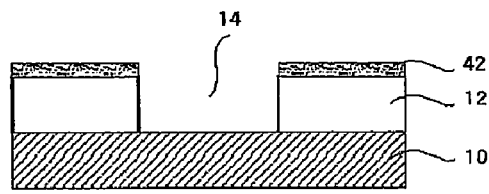

[Fig. 6]
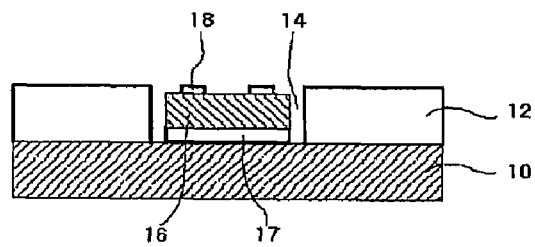
[Fig. 7]
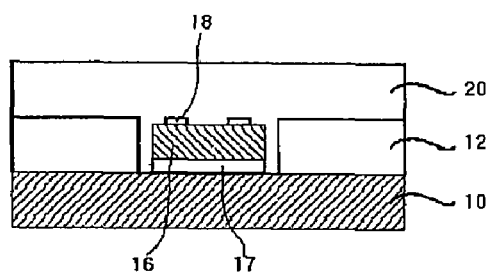
[Fig. 8]
[Fig. 9]
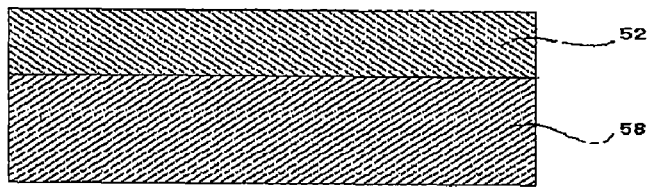
[Fig. 10]
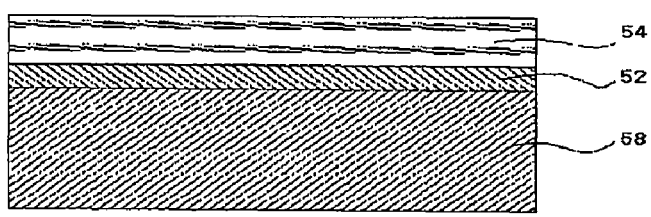
[Fig. 11]
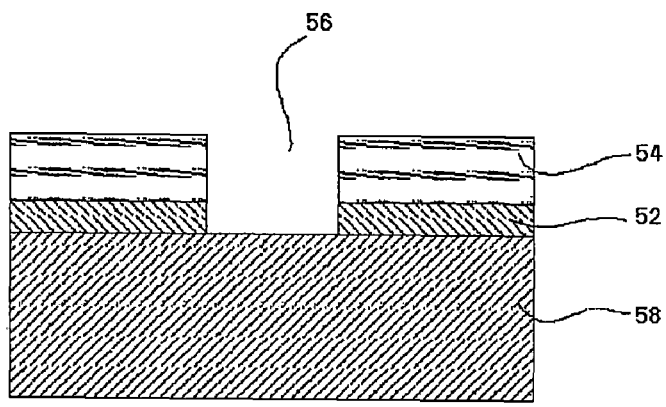

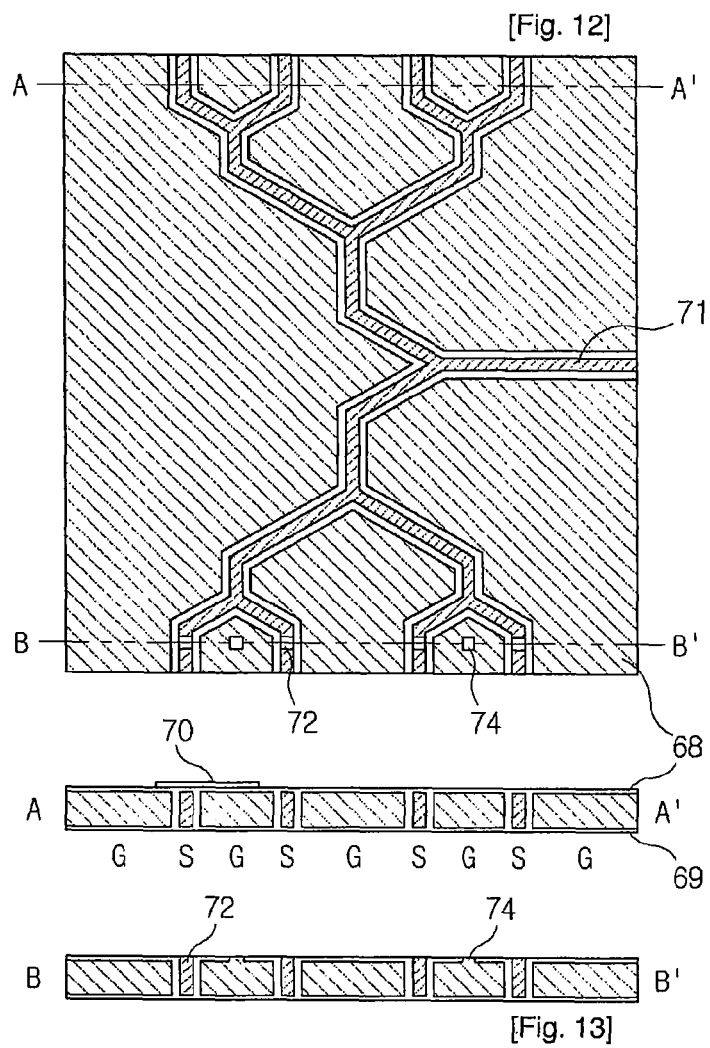
[Fig. 12]
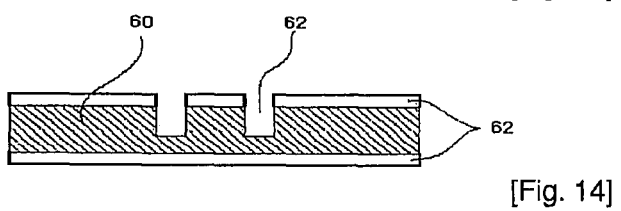
[Fig. 13]
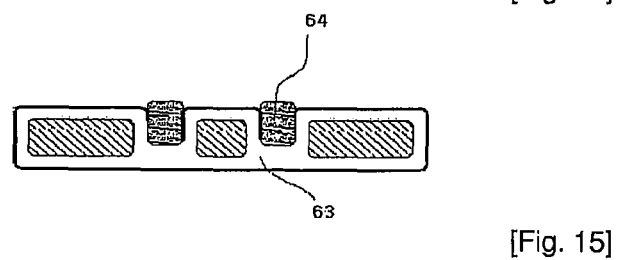
[Fig. 14]
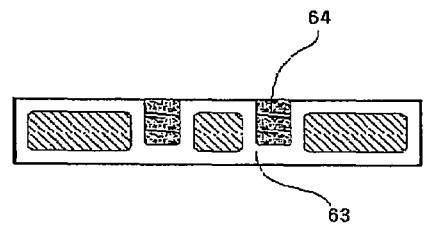
[Fig. 15]

[Fig. 16]
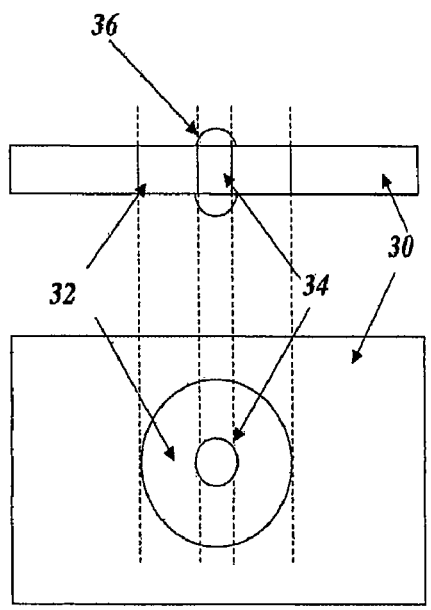
[Fig. 17]
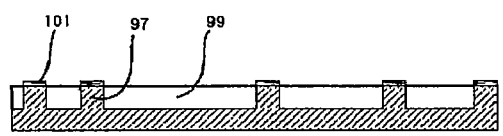
[Fig. 18]
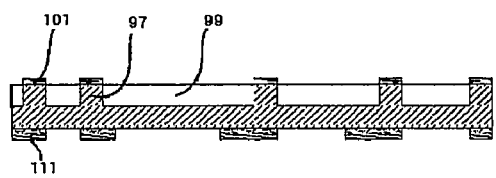
[Fig. 19]
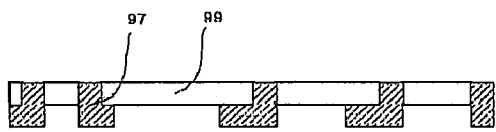
[Fig. 20]
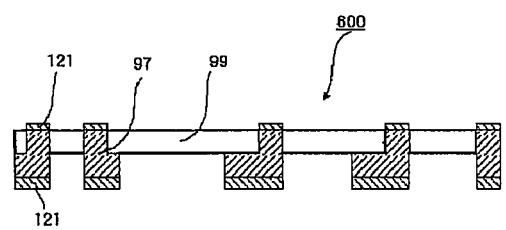
[Fig. 21]
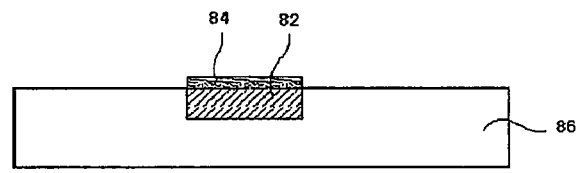

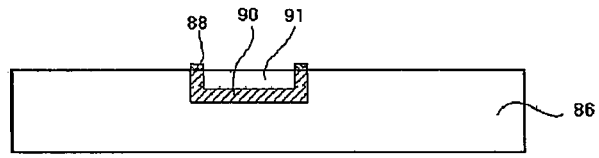
[Fig. 22]
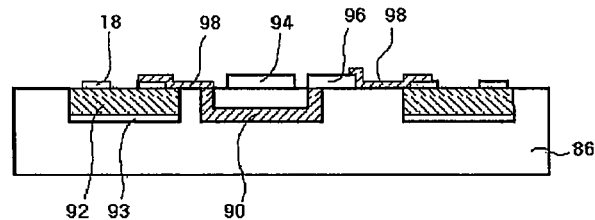
[Fig. 23]
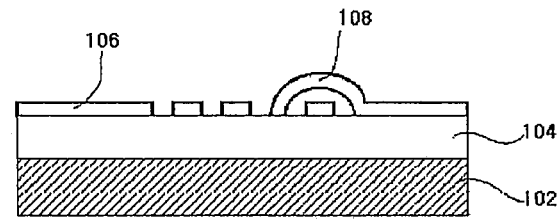
[Fig. 24]
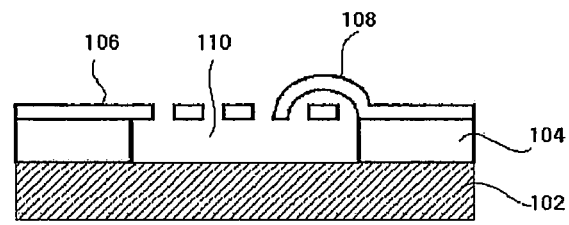
[Fig. 25]
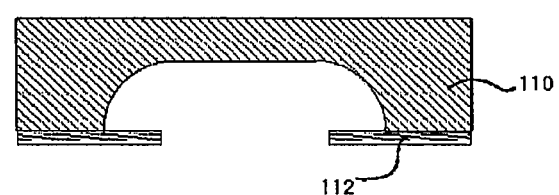
[Fig. 26]
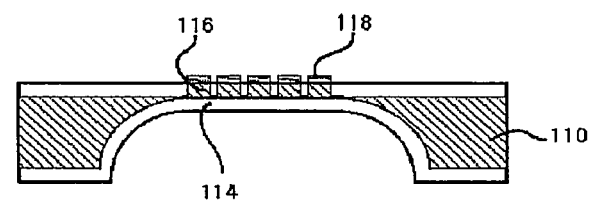
[Fig. 27]
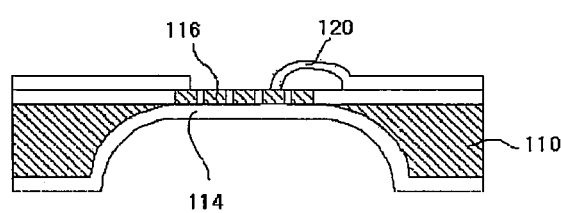
[Fig. 28]

[Fig. 29]
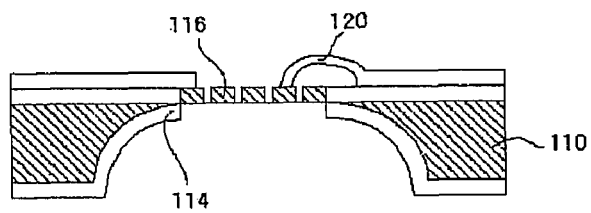
[Fig. 30]
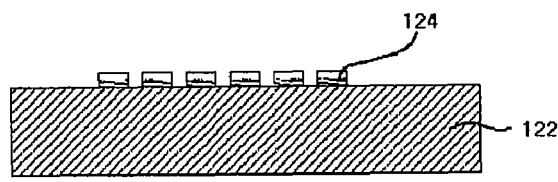
[Fig. 31]
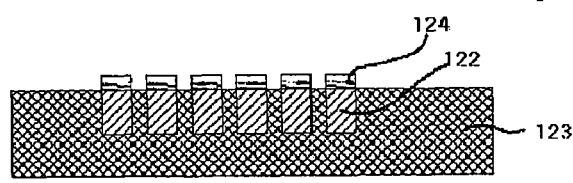
[Fig. 32]
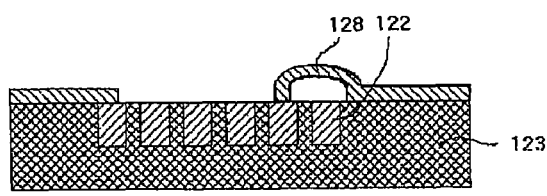
[Fig. 33]
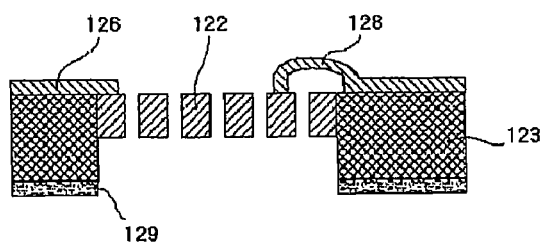
[Fig. 34]
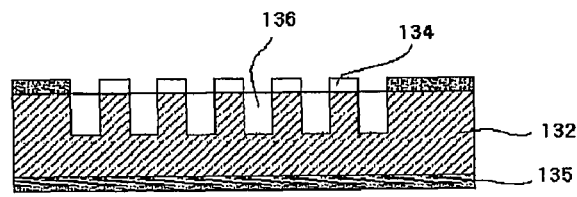
[Fig. 35]
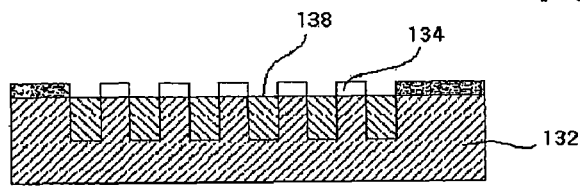

[Fig. 36]
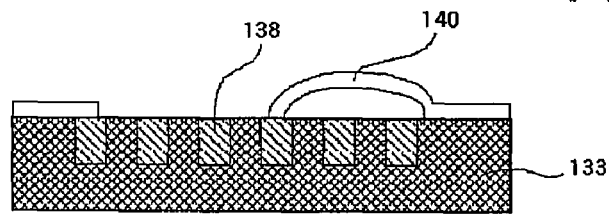
[Fig. 37]
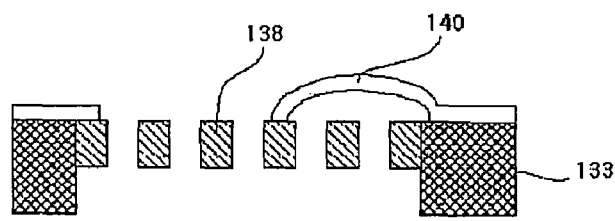
[Fig. 38]
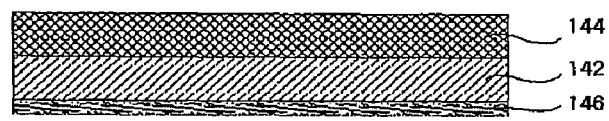
[Fig. 39]
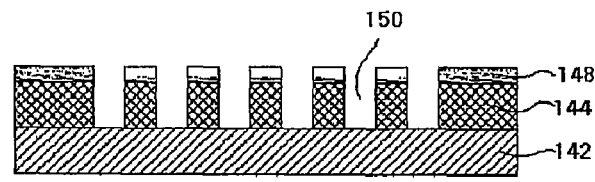
[Fig. 40]
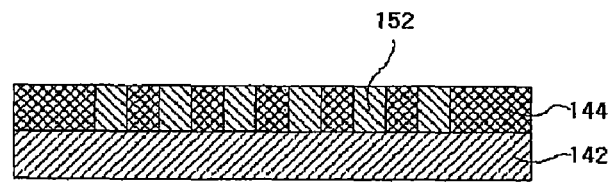
[Fig. 41]
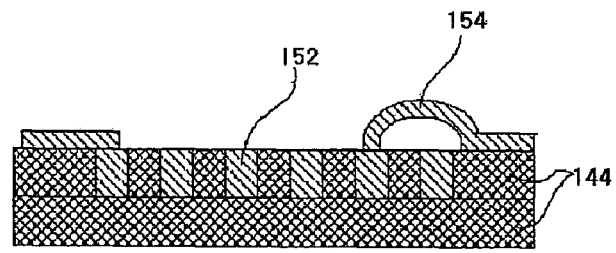
[Fig. 42]
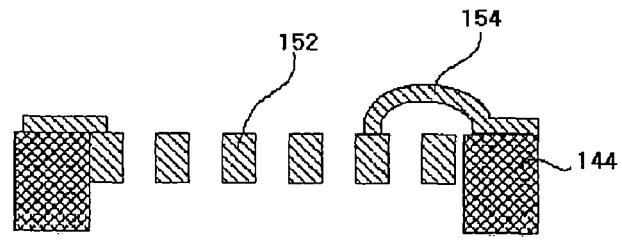

[Fig. 43]
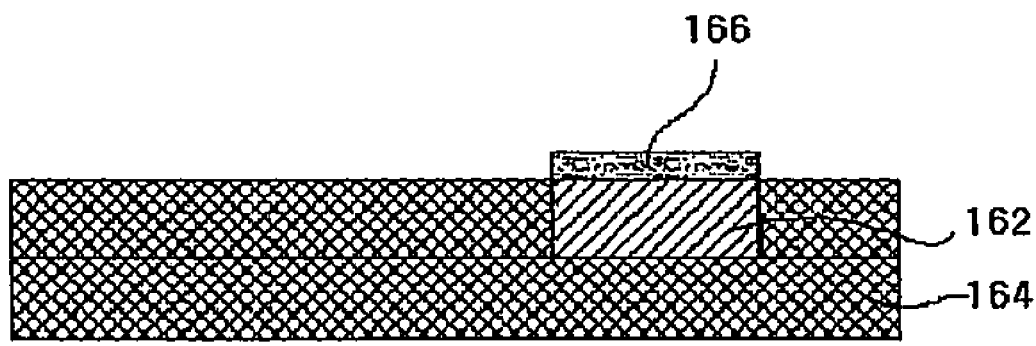
[Fig. 44]
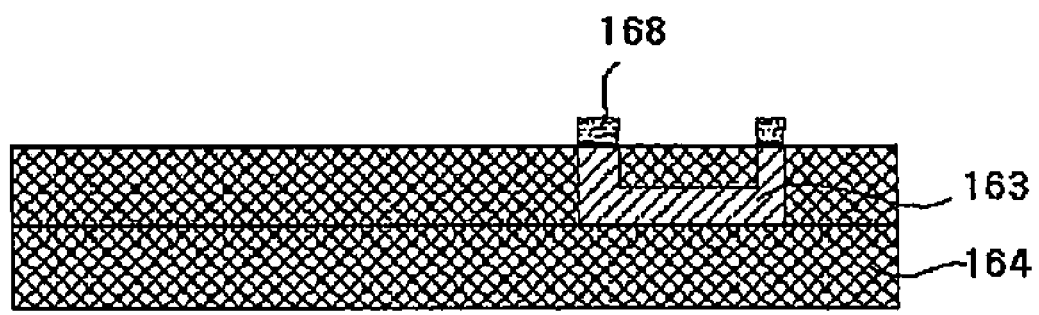
[Fig. 45]
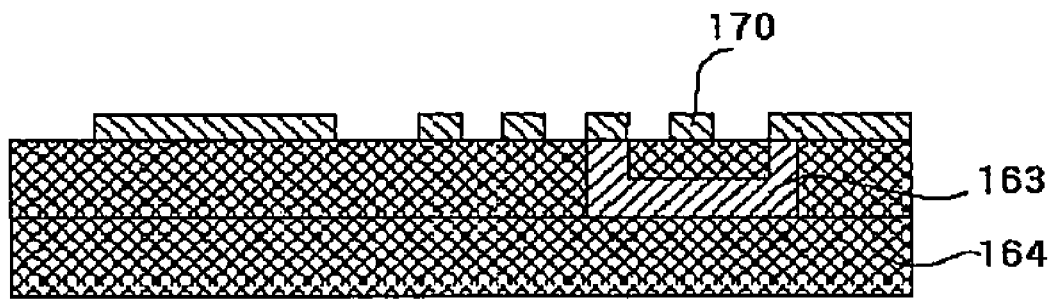

METHOD OF FABRICATING PASSIVE DEVICE APPLIED TO THE THREE-DIMENSIONAL PACKAGE MODULE

CROSS REFERENCE TO RELATED APPLICATIONS

This application is a divisional application of U.S. patent application Ser. No. 12/158,726, filed Jun. 23, 2008, which is a national stage application under 35 U.S.C. 371 of PCT Application No. PCT/KR2006/000751 having an international filing date of Mar. 3, 2006, which designated the United States, which PCT application claimed the benefit of Korean Application Serial No. 10-2005-0133793, filed Dec. 29, 2005. The entire disclosure of each of these priority documents is incorporated herein by reference.

TECHNICAL FIELD

The present invention relates to a semiconductor device packaging, and more particularly, to a three-dimensional aluminum package module that can mount a variety of semiconductor devices in vertical holes formed in the package module, and a method of fabricating a passive device applied to the three-dimensional package module.

BACKGROUND ART

In fabricating semiconductor devices, packaging is a process to protect the semi-conductor chips from an external environment, to shape a semiconductor chip for an easy application, and to protect the operation functions added in the semiconductor chip and thus enhance the reliability of the semiconductor device.

Recently, as the semiconductor devices are highly integrated and their functions become versatile, the packaging is gradually transferred from a process having a small number of package pins to a process having a large number of package pins, and is also converted from a structure where a package is inserted into a printed circuit board (PCB) to a structure where a package is mounted on a surface of a PCB, i.e., surface mounting device structure. Examples of the surface mounting type packages include a small outline package (SOP), a plastic leaded chip carrier (PLCC), a quad flat package (QFP), a ball grid array (BGA), a chip scale package (CSP) and the like.

A chip carrier related with these semiconductor packages or a base substrate used in a PCB should be stable thermally, electrically and mechanically. As the chip carrier or the base substrate for a PCB, a high price ceramic substrate or a resin substrate having a polyimide resin, a fluorine resin or a silicon resin as a base material has been used.

Since the ceramic substrate or resin substrate is made of insulator, it need not deposit an insulation material after the through hole process. However, in the case of resin substrates, since their material cost is expensive and is poor in the moisture-resistant property and heat-resistant property, it is not good to use the resin substrates as the chip carrier substrate. Also, although the ceramic substrate is comparatively superior in terms of heat-resistant property to the resin substrate, the ceramic substrate is also expensive and has disadvantages of a high processing cost as well as a difficulty in the processing.

To overcome the disadvantages of these ceramic substrates or resin substrates, use of a metallic substrate is proposed. The metallic substrate is advantageous in that it is inexpensive, can be easily processed and has a good thermal reliability. However, the metallic substrate requires a separate insulation treatment, which is unnecessary for the aforementioned ceramic or resin substrates, and also requires to attach a metal core serving as a heat sink or a heat spread on an upper surface or a lower surface of a completed substrate so as to more effectively irradiate heat.

In the meanwhile, the chip carrier or PCB prefers a thin and flat one in accordance with the current design trend toward a lightweight, slim and miniaturized profile. To realize the slimness and flatness, a technique that a cavity is formed in a substrate and a chip or a component is mounted on the formed cavity is employed.

In the case of resin substrates, such a cavity is formed by drilling the resin substrate. However, the drilling method takes much time and high cost in processing the cavity. Also, the cavities as formed may have a large deviation, which allows a mounted component to be leaning to one side and makes it difficult to maintain the flatness. Furthermore, since the resin used as the material of the substrate is poor in thermal and mechanical characteristics, when a component is mounted on the substrate, a serious deformation may be caused due to a stress.

DISCLOSURE OF INVENTION

Technical Problem

Accordingly, it is an object of the present invention to provide a three-dimensional package module which is stable thermally and mechanically and makes it easy to maintain the flatness of a metallic substrate by forming a cavity having a vertical side surface where a component is mounted, a fabrication method thereof and a method of fabricating a passive device applied to the three-dimensional package module.

Technical Solution

To accomplish the above object and other advantageous, there is provided a three-dimensional aluminum package module including: an aluminum substrate; an aluminum oxide layer formed on the aluminum substrate and having at least one first opening of which sidewalls are perpendicular to an upper surface of the aluminum substrate; a semiconductor device mounted in the first opening using an adhesive; an organic layer covering the aluminum oxide layer and the semiconductor device; and a first interconnection line and a passive device circuit formed on the organic layer and the aluminum oxide layer.

In an embodiment of the present invention, the above three-dimensional aluminum package module may further include a second interconnection line which is formed along side surfaces and a bottom surface of a second opening formed in the aluminum oxide layer, is buried, and is electrically connected with the first interconnection line and/or a terminal of the semiconductor device.

The aluminum oxide layer may be of $Al_2O_3$, and have a thickness of approximately 100 □.

The organic layer may be a BCB or a polyimide.

In another aspect of the present invention, there is provided a method for fabricating a three-dimensional aluminum package module, the method including: preparing an aluminum substrate having an upper surface and a lower surface; forming an anodization stop masking pattern on a predetermined portion of an upper surface of and an entire area of the lower surface of the aluminum substrate; anodizing the aluminum substrate having the anodization stop masking pattern to oxidize the aluminum substrate to a predetermined depth from the upper surface; removing the anodization stop masking pattern; forming a masking pattern on the anodized upper surface of the aluminum substrate and chemically etching the aluminum substrate to form an aluminum oxide layer having an opening which is perpendicular to the upper surface of the aluminum substrate; removing the masking pattern; mounting a device in the opening using an adhesive; forming an organic insulating layer on the device and the anodized upper surface of the aluminum substrate; and forming a circuit on the organic insulating layer and the aluminum oxide layer.

In another aspect of the present invention, there is provided a three-dimensional aluminum multi-layer package module including: a first signal line formed on an aluminum substrate; a ground part insulated from the first signal line by an insulating layer formed between the signal line and the ground part, the ground part being positioned on the same plane as the first signal line; an alumina layer formed on an upper surface and a lower surface of the first signal line and an upper surface and a lower surface of the ground part; an electronic circuit formed on the upper surface of the alumina layer; and a clock via formed in the alumina layer on the first signal line to electrically connect the first signal line with a device formed on the upper surface of the alumina layer, and a ground via formed in the alumina layer on the ground part to electrically connect the ground part with a ground terminal of the device.

The first signal line may be an inner embedded coplanar wave guide.

The first signal line may be used as a clock signal line or a bias line.

In another aspect of the present invention, there is provided a method of fabricating a three-dimensional metal multi-layer package module, the method including: forming a thick copper layer on a lower surface of an aluminum substrate through a plating; forming an anodization layer at a predetermined thickness on an upper surface of the aluminum substrate; forming an opening exposing an upper surface of the copper layer in the formed anodization layer using a masking and a chemical etching; and mounting a device in the opening.

The above method may further include forming a metal layer between the thick copper layer and the lower surface of the aluminum substrate.

In another aspect of the present invention, there is provided a three-dimensional aluminum package module including: i) a first package module including: an aluminum substrate; an aluminum oxide layer formed on the aluminum substrate and having at least one first opening of which sidewalls are perpendicular to an upper surface of the aluminum substrate; a semiconductor device mounted in the first opening using an adhesive; an organic layer covering the aluminum oxide layer and the semiconductor device; and a first interconnection line and a passive device circuit formed on the organic layer and the aluminum oxide layer; ii) an embedded coplanar wave guide stacked on the first package module and electrically connected with the first package module; and iii) a second package module stacked on the embedded coplanar wave guide and electrically connected with the embedded coplanar wave guide.

The first package module, the embedded coplanar wave guide and the second package module may be electrically connected with one another through a coaxial via.

The second package module may include: an alumina substrate; an interconnection line buried in the alumina substrate; a passive device electrically connected with the interconnection line; and an inductor electrically connected with the interconnection line.

The inductor may be an air-gap inductor floated in air.

The above three-dimensional aluminum package module may further include a redistribution layer interposed between the embedded coplanar wave guide and the second package module, for facilitate an electrical connection between the coplanar embedded wave guide and components of the second package module.

In another aspect of the present invention, there is provided a method of fabricating a passive device applied to a three-dimensional aluminum multi-layer package module, the method including: forming an anodization stop masking pattern on an entire lower surface of an aluminum substrate; anodizing an exposed upper surface of the aluminum substrate to transform a predetermined portion of the aluminum substrate into an alumina layer; forming an etch stop masking pattern on a predetermined portion of an upper surface of the alumina layer and selectively etching an exposed portion of the alumina layer to form an opening; filling the opening with a metal selected from the group consisting of Au, Ni and Cu to form an inductor pattern and removing the etch stop masking pattern; secondly anodizing the aluminum substrate which is not transformed into the alumina layer to transform the aluminum substrate into an alumina layer; and forming a passive device including an interconnection line connected with the inductor pattern on the inductor pattern.

The above method may, after the secondly anodizing the aluminum substrate, further include forming a second etch stop masking pattern on a lower surface of the transformed alumina layer and anisotropically etching an exposed portion of the transformed alumina layer to remove the alumina layer between and below the inductor patterns.

In another aspect of the present invention, there is provided a method of fabricating a passive device applied to a three-dimensional aluminum multi-layer package module, the method including: forming an anodization stop masking pattern on a predetermined portion of an upper surface of and an entire area of a lower surface of an aluminum substrate; anodizing an exposed portion of the aluminum substrate to a predetermined depth to transform the exposed portion of the aluminum substrate into an alumina layer; selectively etching and removing the transformed alumina layer to form a plurality of openings at places where the alumina layer is positioned; forming a plating metal layer of a metal selected from the group consisting of Cu, Au and Ni in the plurality of openings without a seed deposition; removing the anodization stop masking pattern and secondly anodizing the aluminum substrate which is not transformed into the alumina layer to transform the remaining aluminum substrate into an alumina layer; and connecting an inductor electrode with the plating metal layer to complete an inductor.

Advantageous Effects

According to the inventive three-dimensional aluminum package module and fabrication method thereof, the thickness of the package module is remarkably decreased and heat radiation performance is greatly enhanced. Also, since the alumina ($Al_2O_3$) layer is an insulator, a short-circuit danger between a bottom ground and an electrode is substantially decreased.

Further, since the coplanar wave guide and the interconnection line are formed inside the substrate, the integration of the package module can be enhanced.

Furthermore, since the selective anodization is used in a simple method different from the conventional art, a very good quality inductor having a thick metal line and floated in air can be completed.

Moreover, the back end process of an RF circuit having an excellent heat radiation characteristic can be completed. Also, more enhanced characteristic can be expected when a power amplifier module (PAM) is constructed.

In addition, a superior package module technique having a higher heat radiation characteristic than the conventional LTCC and a higher integration than the conventional PCB can be completed.

BRIEF DESCRIPTION OF THE DRAWINGS

FIG. 1 is a schematic sectional view of a three-dimensional multi-layer aluminum package module according to an embodiment of the present invention;

FIG. 2 is a schematic sectional view of a base package module according to an embodiment of the present invention;

FIG. 3 is a modified example of FIG. 2, and shows that the $Al_2O_3$ layer has a plurality of openings such that a plurality of first devices can be mounted in the plurality of openings and connected with a passive device;

FIGS. 4 through 7 are schematic sectional views illustrating a method of fabricating the base package module of shown in FIG. 2 according to another embodiment of the present invention;

FIGS. 8 through 11 are schematic sectional views illustrating a method of fabricating a package module according to another embodiment of the present invention;

FIG. 12 is a schematic view of the embedded coplanar wave guide in the multi-layer package module of FIG. 1;

FIGS. 13 through 15 are sectional views illustrating a method of forming the embedded coplanar wave guide of FIG. 12;

FIG. 16 is a schematic view of a coaxial via applied to a via for a signal transmission in the multi-layer package module shown in FIG. 1;

FIGS. 17 through 20 are sectional views illustrating a method of forming the redistribution layer 500 in the multi-layer package module of FIG. 1;

FIGS. 21 and 22 are sectional views illustrating a method of forming an interconnection line inside a substrate according to another embodiment of the present invention;

FIG. 23 shows an application example of the interconnection line formed inside a substrate while active devices are mounted in the openings of the alumina layer according to another embodiment of the present invention; and FIG. 24 through FIG. 45 are schematic sectional views illustrating structures of a passive device package module applied to the uppermost layer of the multi-layer aluminum package module shown in FIG. 1 and fabrication methods thereof.

BEST MODE FOR CARRYING OUT THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

FIG. 1 is a schematic sectional view of a three-dimensional multi-layer aluminum package module according to an embodiment of the present invention.

Referring to FIG. 1, the three-dimensional multi-layer aluminum package module includes a base package module 300 (see FIG. 3), an embedded coplanar wave guide 400 stacked on the base package module 300, and a passive device package module 600 stacked on the embedded coplanar wave guide 400. Alternatively, the three-dimensional multi-layer aluminum package module may include a redistribution layer 500 interposed between the embedded coplanar wave guide 400 and the passive device package module 600.

FIG. 2 is a schematic sectional view of a base package module according to an embodiment of the present invention.

Referring to FIG. 2, an aluminum oxide layer, for example, an $Al_2O_3$ (alumina) layer 12 is formed on a metallic substrate, for example, an aluminum substrate 10 by an anodization. The alumina layer 12 is then patterned and chemically etched to have an opening 14 of which sidewall is perpendicular to an upper surface of the aluminum substrate 10. In the opening 14, a first device 16, such as PA, LNA, phase shifter, mixer, oscillator, VCO or the like is disposed and is attached on the aluminum substrate 10 using an adhesive 17 interposed therebetween. The first device 16 has an electrode 18 made of copper (Cu) or gold (Au). The $Al_2O_3$ layer 12 is approximately 100 □ thick.

An organic insulating layer 20, for example, BCB or polyimde layer is disposed on the first device 16 having the electrode 18 and the aluminum substrate 10. The organic insulating layer 20 has a contact hole 22 for an electrical contact between the first device and a second device which is being formed in a subsequent process.

A second device 24, for example, a passive device or a pad, is disposed on the organic insulating layer 20 and the $Al_2O_3$ layer 12, and the second device 24 and the first device 16 are electrically connected with each other through an interconnection line 26.

FIG. 3 is a modified example of the base package module shown in FIG. 2, and shows that the $Al_2O_3$ layer 12 has a plurality of openings such that a plurality of first devices can be mounted in the plurality of openings. In this modified example, a matching circuit or another necessary passive circuit 28 is formed between the plurality of first devices 16.

According to the examples of FIGS. 2 and 3, since the first device(s) occupying a large volume is(are) disposed in the opening(s), it is possible to secure a mounting area corresponding to the area occupied by the first device(s). Also, since the second device is not protruded from the surface of the organic insulating layer, the package module can be slimmed. Further, the aluminum substrate 10 becomes a common ground without an artificial manipulation. Since the $Al_2O_3$ layer 12 is an insulator, a short-circuit danger between a bottom ground and the electrode is avoided. Furthermore, since the substrate is made of a metal, heat generated from the first device can be rapidly discharged to an outside.

FIGS. 4 through 7 are schematic sectional views illustrating a method of fabricating the base package module of shown in FIG. 2 according to another embodiment of the present invention.

First, referring to FIG. 4, an aluminum substrate 10 is prepared. After an anodization stop layer 44 is formed on a lower entire surface of the prepared aluminum substrate 10, the aluminum substrate 10 is anodized at a thickness of approximately 100□. The anodized aluminum substrate 10 is patterned except for a desired portion using a photoresist pattern 42 and is then chemically etched to form an opening 14 as shown in FIG. 5.

Referring to FIG. 5, the opening 14 is formed where the first device 16 is being mounted. The opening 14 is perpendicular to the upper surface of the aluminum substrate 10.

Referring to FIG. 6, the first device 16, for example, a PA, LNA, phase shifter or the like, is mounted on the opening 14 using an adhesive 17. The first device 16 has a plurality of electrode terminals on an upper surface thereof.

Referring to FIG. 7, an organic insulating layer 20, for example, a BCB or polyimide layer, is formed at a predetermined thickness on the first device 16 and the $Al_2O_3$ layer 12.

Thereafter, a contact hole is formed at a predetermined portion of the organic insulating layer 20 using a photolithography process.

Thereafter, as shown in FIG. 2, a second device 24 including a pad or passive device is formed on the organic insulating layer 20 and the $Al_2O_3$ layer 12.

Thereafter, an interconnection line 26 is formed to electrically connect the second device 24 with the first device 16.

Meanwhile, as shown in FIG. 3, when the first device 16 is in plurality, it is possible to form a circuit, such as a filter, duplex, IPD or the like while the second device is formed.

FIGS. 8 through 11 are schematic sectional views illustrating a method of fabricating a package module according to another embodiment of the present invention.

First, referring to FIG. 8, a thin aluminum substrate 52 having a thickness of 150-200☐ is provided.

Next, referring to FIG. 9, a thick copper (Cu) film (ex. 350-500☐) is formed on one surface (backside in the example of FIG. 9) of the aluminum substrate 52 by a plating. If necessary, a thin metal film for enhancing a bonding force may be formed on the aluminum substrate 52 prior to forming the Cu film.

Thereafter, the aluminum substrate 52 of FIG. 9 is partially oxidized by a thickness of 100-150☐, so that an upper portion of the aluminum substrate is transformed to an alumina layer 54.

Next, referring to FIG. 11, a predetermined portion of the alumina layer 54 and the underlying aluminum layer 52 is etched using a photolithography process including a masking and a chemical etching until the underlying Cu layer 58 is exposed, so that an opening 56 is formed.

Although not shown in the drawings, an active device, such as PA, LNA, phase shifter or the like, is mounted in the opening 56 using an adhesive, as aforementioned. Since the subsequent processes are the same as those in the previous embodiment, their repeated description will be omitted.

As in the above embodiment, when Cu having a better heat radiation characteristic and higher electrical conductivity is used as the substrate, more enhanced performance can be expected.

Next, construction of the embedded coplanar wave guide 400 will now be described with reference to FIG. 12.

Referring to FIG. 12, a first signal line (S) 71, i.e., an inner embedded coplanar wave guide, is formed in the aluminum substrate, and an upper surface and a lower surface of the aluminum substrate including the first signal line 71 are anodized and covered with a first $Al_2O_3$ layer 68 and a second $Al_2O_3$ layer 69. An electronic circuit is formed on the first $Al_2O_3$ layer 68. The first signal line 71 and a ground portion (G) positioned on the same plane as the first signal line 71 are electrically connected with the electronic circuit on the first $Al_2O_3$ layer 68 through a clock via 72 and a ground via 74, respectively. The first signal line 71, i.e., inner embedded coplanar wave guide, can be used for transmitting a clock signal that may cause a skew. In addition to the aforementioned use, the first signal line 71 can be applied as a signal line, a bias line or the like.

While it is shown that the electronic circuit is formed on first $Al_2O_3$ layer 68, the electronic circuit may be also formed on the second $Al_2O_3$ layer 69.

FIGS. 13 through 15 are sectional views illustrating a method of forming the embedded coplanar wave guide of FIG. 12.

Referring to FIG. 13, in order to form the embedded coplanar wave guide, a via 61 is formed in an aluminum substrate 60 using a masking 62 and a selective etching. The masking 62 is then removed.

Next, referring to FIG. 14, the aluminum substrate 60 having the via 61 of FIG. 13 is anodized to form an $Al_2O_3$ layer 63 on an entire surface thereof. Also, the via 61 is filled with an insulator 64.

Referring to FIG. 15, the upper and lower surfaces of the anodized aluminum substrate 60 and the insulator 64 are polished for the flatness and adjustment of thickness, so that a structure of FIG. 15 is obtained.

Thereafter, an electric circuit is formed on an upper surface of the polished aluminum substrate 60.

Since the aforementioned embedded coplanar wave guide has a small resistance and capacitor component, RC time delay is very low and accordingly, it is possible to transmit signals at a low delay throughout a large area.

FIG. 16 is a schematic view of a coaxial via applied to a via for a signal transmission when the base package module is employed in the multi-layer package module shown in FIG. 1.

Referring to FIGS. 1 and 16, the coaxial via of the present invention includes a donut-shaped $Al_2O_3$ pattern 32 formed in an aluminum substrate 30, a copper plating layer 34 formed within the donut-shaped $Al_2O_3$ pattern 32, and a metal layer 36 formed on both ends of the copper plating layer 34. The metal layer 36 is formed for an electrical connection with a lower base package module and an upper passive circuit package module.

The aforementioned coaxial via can decrease a signal loss and delay compared with the conventional via structure. Also, the coaxial via can be used in a feeding type in forming an antenna on a substrate.

FIGS. 17 through 20 are sectional views illustrating a method of forming the redistribution layer 500 in the multi-layer package module of FIG. 1. When it is difficult to directly stack a passive device package module on the embedded coplanar wave guide 400 of FIG. 1, the redistribution layer 500 is selectively interposed between the passive device package module and the embedded coplanar wave guide 400 so as to make easy an electrical connection therebetween.

Referring to FIG. 17, an aluminum substrate is prepared and then a masking pattern 101 is formed on an upper surface of the aluminum substrate. An exposed surface of the aluminum substrate without the masking pattern 101 is selectively anodized to transform the exposed portion of the aluminum substrate into an alumina layer 99.

Next, referring to FIG. 18, a masking pattern 111 is formed on a lower surface of the aluminum substrate, an exposed portion of the aluminum substrate without the masking pattern 111 is etched, and the masking patterns 101 and 111 are removed to form a structure in which lower and upper electrodes 97 are exposed on both surfaces, as shown in FIG. 18.

Thereafter, a bumper 121 is formed on both surfaces of the lower and upper electrodes 97 as shown in FIG. 20.

Again referring to FIG. 1, the passive device package module 600 applied to the uppermost layer of the multi-layer aluminum package module is provided with passive devices including an interconnection line formed inside the alumina substrate, a resistance, a capacitor and an inductor.

In the passive device package module 600, since the interconnection line is formed inside the substrate, a more wider device mounting area can be obtained on an upper surface of the substrate.

FIGS. 21 and 22 show a method of forming an interconnection line inside a substrate in the passive device package module 600 of FIG. 1.

First, referring to FIG. 21, an aluminum substrate is prepared. Thereafter, a first anodization stop pattern 84 is formed on a first portion and a second portion of the aluminum substrate where an interconnection line is being formed, and the entire surface of the aluminum substrate is anodized. As a result, the entire surface of the aluminum substrate except for a lower portion of the first anodization stop pattern 84 is oxidized and is transformed into an $Al_2O_3$ layer.

Next, referring to FIG. 22, the first anodization stop pattern 84 is removed, a second anodization stop pattern 88 is formed on the first portion of the aluminum substrate where the interconnection line is being formed, and then the resultant substrate is secondly anodized. As a result, the second portion except for the first portion is oxidized and is transformed into an $Al_2O_3$ layer 91, so that an interconnection line pattern 90 is formed inside the aluminum substrate.

FIG. 23 shows an application example of the interconnection line formed inside the aluminum substrate shown in FIG. 10.

Referring to FIG. 23, the semiconductor package module according to an embodiment of the present invention includes the interconnection line 90 formed inside an alumina substrate 86 in the method described with reference to FIGS. 21 and 22. Openings for mounting active devices therein are formed before, after or simultaneously with forming the interconnection line 90. Inside the formed openings, active devices 92, such as PA, LNA, phase shifter, mixer, oscillator, VCO and the like, are mounted interposing an adhesive therebetween. The active devices 92 have a plurality of electrode terminals on an upper surface thereof. On an upper surface of the alumina substrate 86, an integrated passive device (IPD) 94 and a matching circuit 96 are formed. The matching circuit 96 is electrically connected to the electrode terminals of an active device through an upper interconnection line 98 formed on the upper surface of the alumina substrate 86 or a wire bonding.

Thus, by forming the interconnection line inside the alumina substrate 86, it is possible to secure a larger mounting area on the upper surface of the alumina substrate 86.

Again referring to FIG. 1, the inductor in the passive device package module is disposed in air so as to enhance the performance thereof.

FIG. 24 through FIG. 45 are schematic sectional views illustrating structures of inductors applied to the uppermost layer of the multi-layer aluminum package module shown in FIG. 1 and fabrication methods thereof.

First, referring to FIG. 24, an alumina layer 104 is formed at a thickness of approximately 100□ on an aluminum substrate 102. A metallic plating pattern 106 is formed of Au, Cu or Ni on the alumina layer 104 to constitute a part of the inductor pattern and is connected using an air bridge 108 to form an inductor.

Referring to FIG. 25, when the alumina layer disposed below the inductor formed in FIG. 24 is completely wet-etched or partially wet-etched such that the alumina layer right below the pattern is left, an opening 110 is formed to complete an inductor floated in air as shown in FIG. 25.

FIGS. 26 through 29 are schematic sectional views illustrating a method of fabricating an air-gap inductor when an aluminum substrate is thick above 300 □.

First, referring to FIG. 26, a wet-etch stop masking pattern 112 is formed on a lower surface of an aluminum substrate 110. The wet-etch stop masking pattern 112 is formed of $SiO_2$, SiN, photoresist film or the like. Thereafter, the resultant aluminum substrate 110 is wet-etched, so that an exposed portion of the aluminum substrate 110 is isotropically etched away as shown in FIG. 26.

Thereafter, the wet-etch stop masking pattern 112 is removed and a masking pattern 118 for forming an inductor pattern is formed on an upper surface of the aluminum substrate 110. The masking pattern 118 is also formed of $SiO_2$, SiN, photoresist film or the like. Thereafter, both exposed surfaces of the aluminum substrate 110 are anodized to obtain the structure shown in FIG. 27.

Next, the masking pattern 118 is removed, and an inductor electrode and an air bridge 120 are formed to complete an inductor shown in FIG. 28.

Alternatively, an inductor floated in air may be formed by removing the alumina layer 114 between and below the inductor patterns.

FIGS. 30 through 33 are schematic sectional views illustrating a method of fabricating an air-gap inductor when an aluminum substrate is thin below 300 □.

First, referring to FIG. 30, an anodization stop masking pattern 124 is formed on an upper surface of an aluminum substrate 122. The anodization stop masking pattern 124 is formed of $SiO_2$, SiN, photoresist film or the like.

Referring to FIG. 31, the aluminum substrate is anodized throughout an entire surface except for portions corresponding to a predetermined depth below the anodization stop masking pattern 124, and is transformed into an alumina layer 123. Thereafter, the anodization stop masking pattern 124 is removed and an inductor electrode 126 and an air bridge 128 are formed on the alumina layer 123 and the remaining aluminum patterns to complete an inductor as shown in FIG. 32.

Alternatively, as shown in FIG. 33, an etch stop masking pattern 129 is formed on a lower surface of the transformed alumina layer 123 and the resultant substrate is anisotropically etched to remove the alumina layer between and below the inductor patterns, so that an inductor floated in air can be formed.

FIGS. 34 through 37 are schematic sectional views illustrating a method of fabricating an air-gap inductor when an aluminum substrate is thin below 300 □.

First, referring to FIG. 34, an anodization stop masking pattern 134, 135 is formed on a predetermined portion of an upper surface of and an entire area of a lower surface of an aluminum substrate 132. The anodization stop masking pattern 134, 135 is formed of $SiO_2$, SiN, photoresist film or the like. The aluminum substrate 132 exposed without the anodization stop masking pattern 134, 135 is anodized to a predetermined depth from the upper surface thereof, and is transformed into an alumina ($Al_2O_3$) layer 136.

Thereafter, the transformed alumina layer 136 is selectively etched and removed, so that a plurality of openings are formed at places where the alumina layer 136 was formed.

Referring to FIG. 35, a metal plating layer 138, such as Au, Cu or Ni, is formed in the openings without a seed deposition, and the anodization stop masking pattern 135 is then removed.

Referring to FIG. 36, both surfaces of the resultant aluminum substrate of FIG. 35 except for the metal plating layer 138 are anodized and transformed into an alumina layer 133. Thereafter, an inductor electrode and an air-bridge pattern are formed on the transformed alumina layer and the metal plating layer 138 to complete an inductor.

Alternatively, as shown in FIG. 37, an etch stop masking pattern is formed on a lower surface of the transformed alumina layer 133 and the resultant substrate is anisotropically etched to remove the alumina layer between and below the inductor patterns, so that an inductor floated in air can be formed.

FIGS. 38 through 42 are schematic sectional views illustrating a method of fabricating an air-gap inductor when an aluminum substrate is thin below 300 □.

First, referring to FIG. 38, an anodization stop masking pattern 146 is formed on an entire area of a lower surface of an aluminum substrate 142. The anodization stop masking pattern 146 is formed of $SiO_2$, SiN, photoresist film or the like. The aluminum substrate 142 exposed without the anodization stop masking pattern 146 is anodized to a predetermined depth from the upper surface thereof, and is transformed into an alumina ($Al_2O_3$) layer 144.

Referring to FIG. 39, the anodization stop masking pattern 146 is removed, a masking pattern 148 for forming an inductor pattern is formed on the upper surface of the transformed alumina layer 144, and the alumina layer exposed without the masking pattern 148 is anisotropically etched to a predetermined depth, so that a plurality of openings 150 are formed.

Thereafter, a metal plating layer 152 is formed of Au, Cu or Ni in the plurality of openings 150 as shown in FIG. 40.

Referring to FIG. 41, the lower surface of the resultant aluminum substrate is anodized and transformed into an alumina layer 144. Thereafter, an inductor electrode and an air-bridge pattern 154 are formed on the transformed alumina layer and the metal plating layer 152 to complete an inductor.

Alternatively, as shown in FIG. 42, an etch stop masking pattern is formed on a lower surface of the transformed alumina layer 144 and the resultant substrate is anisotropically etched to remove the alumina layer between and below the inductor patterns, so that an inductor floated in air can be formed.

Unlike in the previous embodiments, FIGS. 43 through 45 show an example that an inductor is connected by an electrode formed inside a substrate without an air-bridge process.

First, referring to FIG. 43, a first anodization stop masking pattern 166 is formed on a predetermined portion of an upper surface of an aluminum substrate 162. The first anodization stop masking pattern 166 is formed of $SiO_2$, SiN, photoresist film or the like. Both surfaces of the aluminum substrate 162 exposed without the first anodization stop masking pattern 166 are firstly anodized, and are transformed into an alumina ($Al_2O_3$) layer 164.

Referring to FIG. 44, the first anodization stop masking pattern 166 is removed, and a second anodization stop masking pattern 168 is formed on the upper surface of a remaining alumina layer 162. The alumina layer 162 exposed without the second anodization stop masking pattern 168 is secondly anodized to a predetermined depth, so that an inductor bridge pattern 163 is formed inside the transformed alumina layer 164. At this time, it is required that the time for the second anodization be shorter than the time for the first anodization such that the exposed aluminum layer is not completely anodized but partially remains without being transformed by a predetermined thickness.

Referring to FIG. 45, an inductor patterning and a plating are performed so that an inductor pattern 170 and a bridge pattern 163 are electrically connected with each other, thereby completing an inductor.

It will be apparent to those skilled in the art that various modifications and variations can be made in the present invention. Thus, it is intended that the present invention covers the modifications and variations of this invention provided they come within the scope of the appended claims and their equivalents.

The invention claimed is:

1. A method for fabricating a three-dimensional aluminum package module, the method comprising: preparing an aluminum substrate having an upper surface and a lower surface; forming an anodization stop masking pattern on a predetermined portion of an upper surface of and an entire area of the lower surface of the aluminum substrate; anodizing the aluminum substrate having the anodization stop masking pattern to oxidize the aluminum substrate to a predetermined depth from the upper surface; removing the anodization stop masking pattern; forming a masking pattern on the anodized upper surface of the aluminum substrate and chemically etching the aluminum substrate to form an aluminum oxide layer having an opening which is perpendicular to the upper surface of the aluminum substrate; removing the masking pattern; mounting a device in the opening using an adhesive; forming an organic insulating layer on the device and the anodized upper surface of the aluminum substrate; and forming a circuit on the organic insulating layer and the aluminum oxide layer.

2. The method of claim 1, wherein the aluminum oxide layer is of $Al_2O_3$, and has a thickness of approximately 100 D.

3. The method of claim 1, wherein the organic layer is a BCB or a polyimide.

4. The method of claim 1, further comprising: forming a thick copper layer on a lower surface of an aluminum substrate through a plating; forming an anodization layer at a predetermined thickness on an upper surface of the aluminum substrate; forming an opening exposing an upper surface of the copper layer in the formed anodization layer using a masking and a chemical etching; and mounting a device in the opening.

5. The method of claim 4, further comprising forming a metal layer between the thick copper layer and the lower surface of the aluminum substrate.

* * * * *